United States Patent [19]

Wheeler et al.

[11] 4,198,741
[45] Apr. 22, 1980

[54] APPARATUS FOR FORMING LEADS

[75] Inventors: Ronald H. Wheeler, E. Syracuse; John R. Batruch, Elbridge, both of N.Y.

[73] Assignee: The Eraser Co., Inc., Syracuse, N.Y.

[21] Appl. No.: 899,087

[22] Filed: Apr. 24, 1978

[51] Int. Cl.² .............................................. B21F 11/00
[52] U.S. Cl. ...................................... 29/566.3; 29/566
[58] Field of Search ................... 29/566, 566.3, 566.2, 29/564.6, 564.1; 198/481; 206/330; 221/82, 266, 312, 225, 239, 217

[56] References Cited

U.S. PATENT DOCUMENTS

| | | | |
|---|---|---|---|
| 2,003,519 | 6/1935 | Schnaier | 198/481 X |
| 2,757,778 | 8/1956 | Lyons | 198/481 |
| 2,896,213 | 7/1959 | Alderman et al. | 29/566.3 |
| 2,985,275 | 5/1961 | Lane | 198/481 X |
| 3,200,481 | 8/1965 | Lenders | 29/564.1 |
| 3,310,301 | 3/1967 | Netta et al. | 221/217 X |
| 3,478,703 | 11/1969 | Peppler et al. | 425/126 S |
| 3,596,486 | 8/1971 | Dolder | 206/330 X |
| 3,799,322 | 3/1974 | Van Linder et al. | 198/481 |

*Primary Examiner*—William R. Briggs
*Attorney, Agent, or Firm*—Bruns & Jenney

[57] ABSTRACT

Apparatus for use in a machine for trimming and shaping the leads of electrical components wherein the components are advanced through a series of work stations by means of a plurality of sprocket wheels. A pair of guide elements are provided which engage the leads to seat them upon the sprocket drive and to positively hold the leads thereon as the components are advanced through the work stations.

6 Claims, 3 Drawing Figures

APPARATUS FOR FORMING LEADS

BACKGROUND OF THE INVENTION

This invention relates to means for preforming electrical components prior to mounting them in a circuit board or the like. More specifically, this invention relates to apparatus for cutting and preshaping the wire leads of electrical components to a desired configuration.

As is well known in the art, a number of machines are presently available which are capable of preparing electrical components, such as resistors or capacitors, prior to their being mounted in circuit boards, chassis or the like. Typically, the component will include a cylindrical body section from whose end walls axially extend a pair of wire leads or pig-tail connections. Depending upon its intended use, the wire leads are usually precut by the machine to a prescribed length and the leads then crimped or preshaped to a desired form. Conventionally, the final form involves a U-shaped arrangement wherein the body section of the component is located along the base leg of the structure. A machine of this type is disclosed by Dolder in U.S. Pat. No. 3,596,486.

In order to increase productivity, and to eliminate to some extent human error, many existing machines are adapted to accept a taped input wherein the components are supported in spaced parallel alignment by means of adhesive strips that are arranged to engage the two outer extremities of the leads. The tape supply is generally wound upon a spool and, as described by Dolder, the tape threaded upon a drive mechanism containing a number of coacting sprocket wheels which engage the component leads. In operation, the drive advances the work past cutting and forming tools to carry out the desired operations. The severed taped ends of the leads are ejected from the machine while the formed components are collected within a bin.

Oftentimes, however, it is desirous or necessary to hand load individual components into the machine when small quantities of components are needed. In this type of application, the electrical elements are fed one at a time into the drive sprockets using an entry chute adapted to properly position and align the elements for proper engagement by the drive.

Heretofore, machines that were specifically designed for a taped input were not necessarily compatible for use in conjunction with a manual input. Typically, the teeth of the drive sprocket wheels are provided with a deep contour to securely engage and positively seat the leads therebetween to insure proper engagement with the processing tools. The deep sprocket tooth contour, although well suited to act in conjunction with a taped lead input may nevertheless be unreliable when handling loose individual elements. An improperly seated or misaligned component can be drawn into a work station where it might become jammed and cause injury to the machine.

Moreover, in many sprocket drive machines, the positioning of the work stations is restricted to locations above the horizontal centerline of the drive to prevent the electrical components from prematurely falling out of the teeth while they are in transit. This, of course, restricts the amount of usable space afforded, limits the flexibility of machine design and requires, generally, that the machine be overly large in size.

SUMMARY OF THE INVENTION

It is therefore an object of the present invention to improve sprocket drive lead forming machines.

A further object of the present invention is to improve a sprocket drive lead forming machine so that it can accept, with equal reliance, a continuous taped input or individually fed work elements.

A still further object of the present invention is to extend the amount of usable working space afforded in a sprocket drive lead forming machine.

Another object of the present invention is to hold the leads of an electrical component securely seated within the teeth of a drive sprocket as the component is being transported through a series of work stations adapted to cut and form the leads.

Yet another object of the present invention is to afford greater flexibility in the positioning of work stations within a sprocket drive lead forming machine.

These and other objects of the present invention are attained by means of lead forming apparatus that includes a sprocket drive for engaging the leads of an electrical component and advancing the component through a series of work stations to cut and form the component to a prescribed shape, guide means positioned adjacent the drive wheels for directing the leads into secure seating contact between the sprocket teeth and for holding the leads in this condition as they are presented to each of the tools regardless of the tool's location in respect to the drive.

BRIEF DESCRIPTION OF THE DRAWINGS

For a better understanding of these and other objects of the present invention reference is had to the following description of the invention to be read in conjunction with the following drawing, wherein.

DESCRIPTION OF THE INVENTION

Figure 1:
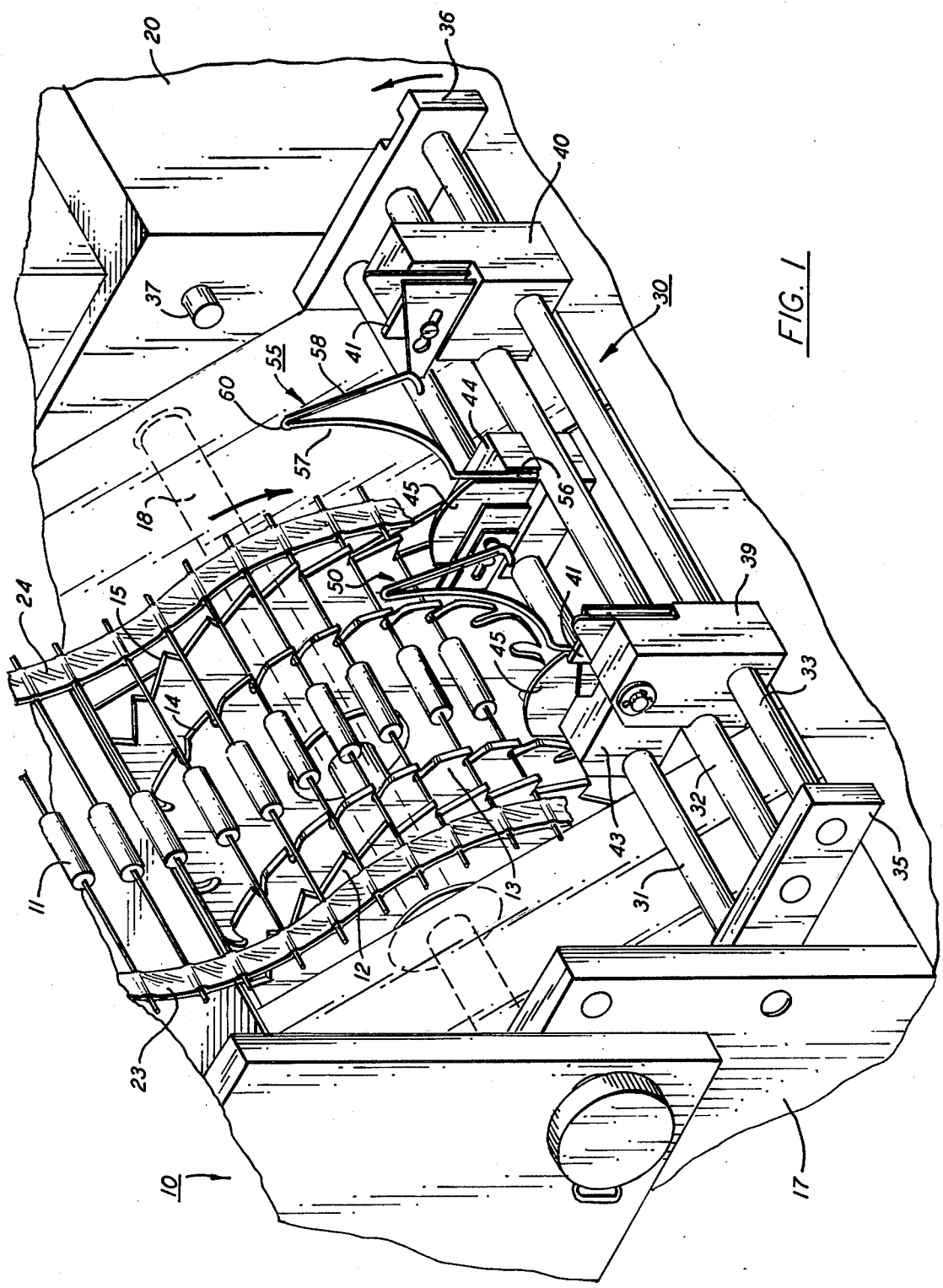
FIG. 1 is an enlarged partial perspective view of a lead forming machine embodying the teachings of the present invention.

Referring initially to FIG. 1, there is shown a lead forming machine 10 for cutting and shaping the leads of electrical components, such as resistors 11, prior to their being mounted within a circuit board or the like. A series of four sprocket wheels 12–15 are mounted within the machine frame 17 upon a common horizontally aligned drive shaft 18 rotatably supported therein. The right hand end of the shaft, as viewed in FIG. 1, passes into drive housing 20 where it is coupled to a suitable drive means (not shown) for rotating the shaft in a clockwise direction. The disc-like sprocket wheels are slidably mounted on the shaft so that they may be independently positioned in a horizontal direction along the shaft. Suitable clamping means, as is well known in the art, is operatively associated with each wheel to lock it to the shaft at a desired location. As will be explained in greater detail below, this feature provides the machine with a certain amount of versatility such that the geometry of the finished components produced therein may be varied to suit the user's needs.

Figure 3:
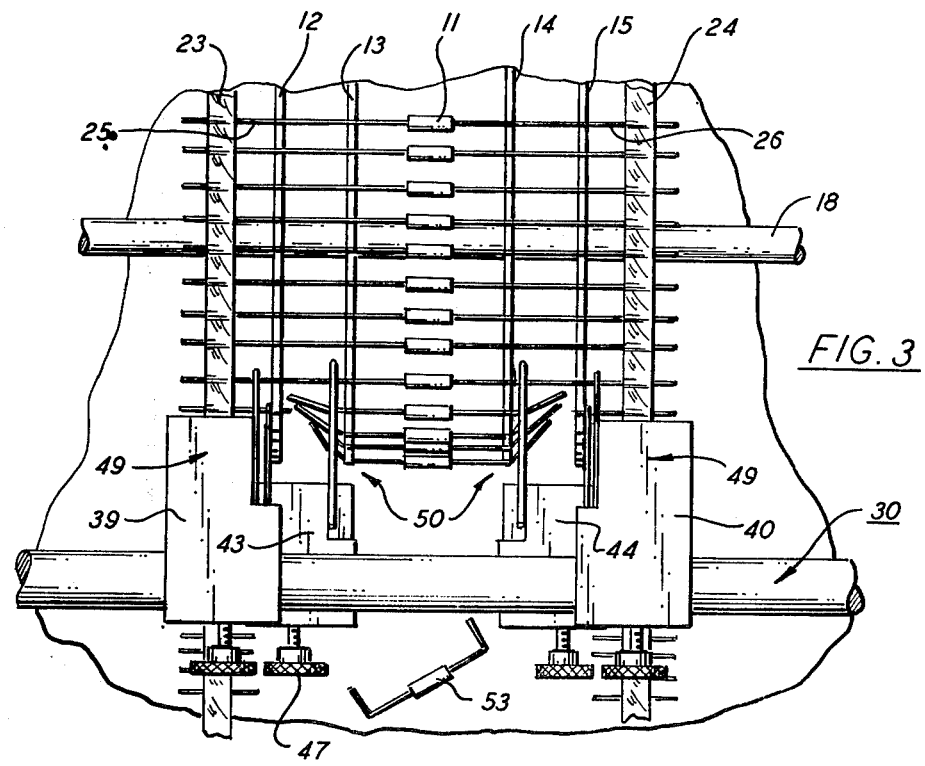
FIG. 3 is a partial top plan view of the present machine showing a taped input being processed through the various work stations.

As illustrated in FIGS. 1 and 3, the machine is adapted to accept a taped input supplied from a spool in the manner set forth in the previously noted Dolder patent. As best seen in FIG. 1, the resistors 11 are supported in spaced parallel alignment by means of two adhesive backed tapes 23,24 that are arranged to securely engage both axially extended wire leads 25,26 of the resistors outboard of the two outer sprocket wheels 12 and 15. The spacing or pitch between the leads of each of the components secured within the tapes is equal to the circumferential pitch between each of the sprocket teeth whereby the extended leads are seated within the openings provided between the teeth of the sprocket wheels.

Figure 2:
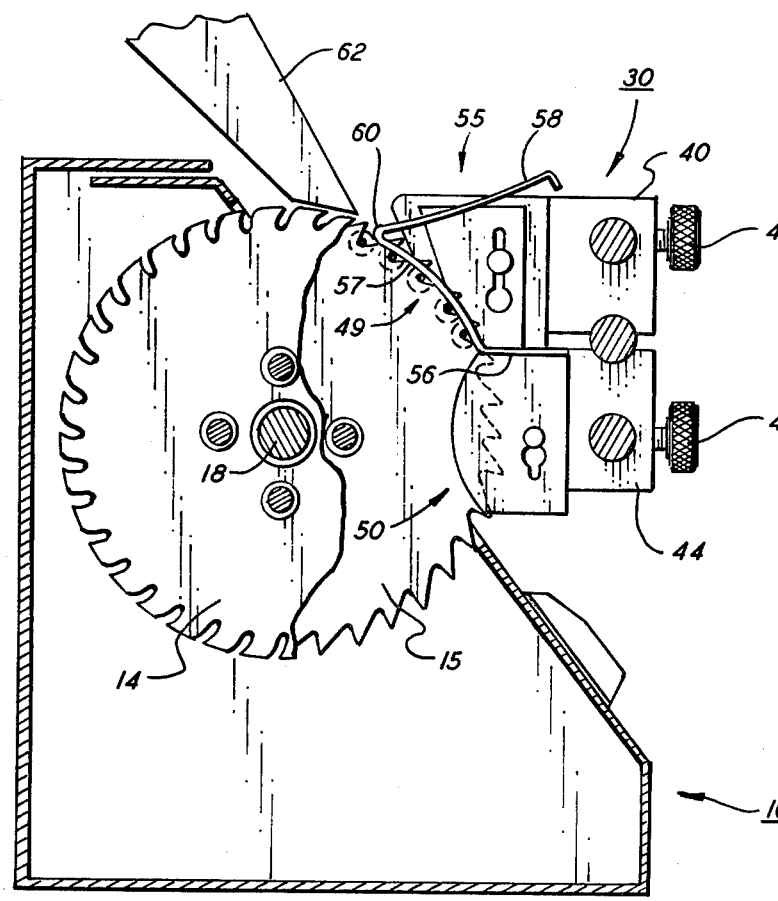
FIG. 2 is a side elevation of the machine shown in FIG. 1 with portions broken away to more clearly show the drive mechanism and work stations utilized therein.

As best seen in FIGS. 1 and 2, a tool support carriage, generally referenced 30 is pivotably supported at the front of the forming machine. The carriage includes three circular guide rails 31-33 carried in parallel alignment between two end plates 35,36. The lower guide rail 31 passed through the end plates and is rotatably supported in the main machine frame so that the entire carriage can be pivoted between a fully opened position as shown in FIG. 1 to a fully closed position as shown in FIG. 2. A stop 37 is provided against which end plate 36 is arrested to properly align the carriage in the operative or closed position.

Two pairs of tool posts are slidably carried upon the carriage guide rails. The two upper posts 39-40 are adapted to adjustably support a pair of cutting blades 41—41 therein. The lower tool posts 43,44 similarly support a pair of forming dies 45—45. In operation, when the carriage is raised to an operative position, the knife edge of each blade is brought into contiguous relation with the outside end faces of wheels 12 and 15 to provide a first work station 49 (FIG. 3). At the same time, the forming dies are similarly brought adjacent to the outer end faces of sprocket wheels 13,14 to establish a second work station 50. The slidably mounted posts, after being set up in relation with the sprocket wheels, are locked in position by means of thumb screws 47 which are threaded into contact against rails 31 and 33.

Referring now to FIG. 3, as the wire leads of the components are picked up by the teeth of the moving sprocket wheels, they are advanced along a circular path of travel through the two work stations 49 and 50 where the leads are first cut to size and are then formed. The severed taped ends of the components are allowed to pass out of the machine as scraps. The trimmed electrical components are advanced by the inner sprocket wheels downwardly into operative contact with the working surface of the forming dies which serve to bend or crimp the wire leads as they are drawn between the side of each die and the end face of the coacting adjacent sprocket wheel. As a result of this motion, a generally U-shaped element 53 (FIG. 3) is produced although other forms may be similarly generated. Ejecting means, not shown, are usually provided to remove the formed components from the sprocket wheels and deposit them in a collecting bin.

In this particular embodiment of the invention, the teeth that are carried upon the two outer or cutting sprocket wheels are generated to a different shape than those found on the inner or forming sprocket wheels so as to more effectively carry out the two different operations. The openings between the teeth on the inner sprocket wheels are generally more confining than those on the outer wheels in order to provide for a more positive engagement as the leads are being drawn past the forming dies.

As noted above, it has generally proven rather difficult to properly input individual components upon the sprocket wheels, particularly where the tooth contour of the wheel or wheels is designed to circumscribe the wire leads of the element. Moreover, individually fed components, or those severed from a taped input, tend to move out of their optimum forming position as the wheels move forward. In fact, when the lead embracing teeth move toward or through a horizontal position, the driven elements will ordinarily tend to fall out of the openings between the teeth. This, of course, seriously restricts the location at which the various work stations can be positioned about the wheels thereby wasting valuable machine space and limiting the flexibility of design.

In order to overcome these difficulties and to further enhance the operating efficiency of the machine, resilient guide elements 55—55 are supplied to facilitate the input of individual work elements and to positively seat the leads in the wheels as they are advanced through the various work stations regardless of their location about the wheels. The elements can be fabricated of any generally resislient material that exhibits relatively high strength. Preferably, the elements are formed from a round piece of spring steel. Each guide element has a relatively complex geometry that includes a base leg 56, an arcuate shaped body section 57 and an upwardly turned entrance ramp arm 58.

In assembly, the base leg of each guide element is securely affixed to the top surface of each performing die by any suitable means. The guide elements are situated in assembly upon the die members with the arcuate shaped body section thereof being positioned adjacent to the outer face of the two inside sprocket wheels. Each body section possesses a radius of curviture that is substantially equal to the pitch line radius of the adjacent sprocket wheel and generally parallels the pitch line circle. The chordal length of each body section is such that each guide element is caused to pass through work station 49 containing the cutting tool or blade and is turned outwardly to form a curved lip 60 at the entrance to the first work station.

A chute 62, of any suitable design known and used in the art, is located at about the 12 o'clock position in reference to the sprocket wheels. The chute is arranged to gravity feed individual components, one at a time, onto the rotating wheels whereby the body of each component is positioned between the two inner sprocket wheels. Under the influence of the moving wheels, the axially extended leads are brought into contact with the curved lips of the guide elements and carried thereunder. As the wheels continue to advance the components, the leads are directed downwardly into seating contact between the sprocket teeth. In operation, the guide elements exert a biasing force against the leads to continually hold the components in operative relation against the wheels as they are transported through the various work stations. The leads are released by the components only after they have been directed into working relationship with the tool or die located in the last work station of the series.

As best illustrated in FIG. 2, each of the guide elements is turned outwardly from the wheels to establish a ramp through the cooperation of arms 58. In practice, the ramp serves two functions. First, it is capable of retaining thereon any components that might inadvertently pass over the top of the lips, rather than passing thereunder, whereupon the component is permitted to drop back into contact with the sprocket wheels. Secondly, the ramp also provides a secondary or auxiliary feeding means which avoids the need of having to affix or otherwise mounting an independent input chute to the machine, particularly in the case where only a short production run is required. As noted above in reference to the operation of chute 62, the components can be hand fed, one at a time, onto the ramp and permitted to slide downwardly onto the sprocket wheels at the entrance to the first work station. Here again, the leads are captured between the teeth of the sprocket wheels and carried beneath the lips of the guide elements into the various work stations.

As should be evident from the disclosure above, the guide elements of the present invention do not impede or otherwise interfere with the efficient operation of the machine when a taped input is being processed. In fact, the elements serves to further enhance the performance of the machine in that they direct the components through each of the work stations in a positive manner. At the same time, the guides allow the machine to accept a hand fed or cartridge fed input or individual components without having to perform a major modification thereon. In either case, the guide elements are designed to positively engage each component to be processed so as to securely seat the components upon the sprocket drive and direct the components into contact with the tools located in the various work stations. It should be noted, that the guide elements further allows for a great deal of flexibility concerning the location of the work stations about the sprocket wheels in that the stations are no longer restricted to locations situated above the horizontal centerline of the drive wheels.

While this invention has been described with specific reference to the details as set forth above, it is not necessarily confined to this particular embodiment and the invention is intended to cover any modifications or changes as may come within the scope of the following claims.

We claim:

1. In a machine for trimming and shaping the outwardly extending leads of electrical components wherein the leads are seated between the teeth located upon coacting drive sprockets that are arranged to transport the components through two independent work stations including a first lead cutting station and a second lead forming station, the improvement comprising a pair of stationary cutting blades mounted in the first station for engaging the outwardly extended leads of a component being transported therethrough to trim the leads to a predetermined length, a pair of forming dies positioned in the second station that are arranged to contact the leads being transported therethrough and form the leads into a desired shape, a guide element secured within the second station to each of the dies and having an arcuate shaped body section positioned along the side wall of one of said sprockets and extending rearwardly in regard to the direction of sprocket movement, each guide element being formed of a single piece of spring steel that is adapted to ride in contact against a lead seated in said sprocket to hold the lead therein and direct it into contact with the forming die, a contoured lip depending from said body section at the entrance to the cutting station that is turned outwardly in regard to the sprocket whereby a lead transported into the first station passes under the guide prior to contacting the forming die, and an arm depending outwardly from said lip to form a ramp for directing the leads into the sprocket at the entrance to the first station.

2. In a machine for shaping the leads of electrical components wherein the leads are seated between the teeth of a plurality of drive sprocket wheels and advanced thereby through a series of work stations, the machine including a pair of guide elements formed of a resilient material, each element further including, a base leg securely mounted within the last work station in the series, an arcuate shaped body section which is positioned adjacent to the side wall of one of the sprocket wheels and being arranged to ride in contact against the lead of a component being advanced by said sprocket wheel to hold said lead seated thereon, said body extending rearwardly back through the other work stations, a contoured lip depending from the body section at the entrance to the first work station, the lip being turned outwardly in reference to the sprocket wheel and adapted to direct the leads of the components being advanced by said sprocket under said guide and an outwardly extended arm depending from said contoured lip whereby the arms combine to form a ramp for gravity feeding components onto the sprocket wheels at the entrance to the first work station.

3. The machine of claim 2 further including chute means for gravity feeding components onto the sprocket wheels at the entrance to the first work station.

4. The machine of claim 2 further including a pair of forming dies located in said last work station with each die being positioned adjacent to said one sprocket wheel and having a working surface arranged to contact the lead of a component being advanced therethrough, said base leg of each guide element being affixed to one of said dies to position the body section thereof so as to direct the leads of the components into contact with the working surface of the die.

5. The machine of claim 4 wherein each guide element is fabricated of a single piece of spring steel.

6. The machine of claim 5 further including a pair of stationary knife blades located in said first work station for cutting the leads moved therethrough to a desired length.

* * * * *